United States Patent
Reck et al.

(10) Patent No.: US 6,329,806 B1
(45) Date of Patent: Dec. 11, 2001

(54) PROCESS FOR DETERMINING THE HARMONIC OSCILLATIONS OF THE FUNDAMENTAL COMPONENT OF AN ELECTRICAL SIGNAL

(75) Inventors: Thomas Reck; Tevfik Sezi, both of Berlin (DE)

(73) Assignee: Siemens AG, Munich (DE)

( * ) Notice: Subject to any disclaimer, the term of this patent is extended or adjusted under 35 U.S.C. 154(b) by 0 days.

(21) Appl. No.: 09/168,501

(22) Filed: Oct. 8, 1998

Related U.S. Application Data

(63) Continuation of application No. 08/750,234, filed as application No. PCT/DE95/00671 on May 16, 1995, now Pat. No. 5,889,398.

(30) Foreign Application Priority Data

Jun. 1, 1994 (DE) .................................................. 44 20 348

(51) Int. Cl.$^7$ ........................ G01R 13/14; G01R 13/34; G01R 23/00
(52) U.S. Cl. ................................ 324/76.24; 324/76.42; 324/76.58; 702/75
(58) Field of Search .............................. 324/76.24, 76.21, 324/76.19, 76.42, 76.58; 702/75, 77; 708/405, 403–409

(56) References Cited

U.S. PATENT DOCUMENTS

| | | | |
|---|---|---|---|
| 4,918,381 | 4/1990 | Bender et al. ........................ | 324/76.24 |
| 4,928,251 | 5/1990 | Marzalek et al. .................... | 324/76.42 |
| 4,965,757 | * 10/1990 | Grassart ............................... | 702/73 |
| 5,099,194 | 3/1992 | Sanderson et al. .................. | 324/78 |
| 5,508,605 | 4/1996 | Lo et al. .............................. | 324/76.42 |
| 5,889,398 | * 3/1999 | Reck et al. .......................... | 324/76.24 |
| 5,912,829 | * 6/1999 | Maier .................................. | 708/404 |
| 5,999,573 | * 12/1999 | Zangi .................................. | 375/316 |

FOREIGN PATENT DOCUMENTS

| | | |
|---|---|---|
| 42 11 946 | 9/1993 | (DE) . |
| 43 30 179 | 3/1995 | (DE) . |
| 63101767 | 5/1988 | (JP) . |
| WO 93/20454 | 10/1993 | (WO) . |

OTHER PUBLICATIONS

K. Weignardt et al., "Elektronik" 2, Jan. 23, 1987, pp. 89–96.

J. Heydeman et al., "Microprocessor Based Underfrequency Relaying", Delft University of Technology, the Netherlands, Third Internal Conference on Developments in Power System Protection, 1985, pp. 24–28.

* cited by examiner

Primary Examiner—Safet Metjahic
Assistant Examiner—Anjan K Deb
(74) Attorney, Agent, or Firm—Kenyon & Kenyon

(57) ABSTRACT

The present invention relates to a process for determining harmonic oscillations of a fundamental component of an electrical signal, wherein the signal is sampled with a sampling frequency corresponding to a multiple of the fundamental component's frequency. The sampled values of the signal are subjected, after analog-to-digital conversion, to a discrete Fourier transformation to determine the harmonic oscillations. The sampling is performed with a non-integer multiple of the frequency of the fundamental component and the discrete Fourier transformation is performed while the frequency resolution is increased over several periods of the fundamental component to determine the harmonic oscillations.

2 Claims, 3 Drawing Sheets

| k | $SL_u$ Hz | | $SL_0$ Hz |
|---|---|---|---|
| 0 | 0 DC | | 990 |
| 1 | 30 H16 | ← | 960 H16 |
| 2 | 60 H1 | | 930 |
| 3 | 90 H15 | ← | 900 H15 |
| 4 | 120 H2 | | 870 |
| 5 | 150 H14 | ← | 840 H14 |
| 6 | 180 H3 | | 810 |
| 7 | 210 H13 | ← | 780 H13 |
| 8 | 240 H4 | | 750 |
| 9 | 270 H12 | ← | 720 H12 |
| 10 | 300 H5 | | 690 |
| 11 | 330 H11 | ← | 660 H11 |
| 12 | 360 H6 | | 630 |
| 13 | 390 H10 | ← | 600 H10 |
| 14 | 420 H7 | | 570 |
| 15 | 450 H9 | ← | 540 H9 |
| 16 | 480 H8 | | 510 |

FIG. 3

PROCESS FOR DETERMINING THE HARMONIC OSCILLATIONS OF THE FUNDAMENTAL COMPONENT OF AN ELECTRICAL SIGNAL

This is a continuation of Ser. No. 08/750,234 filed Mar. 17,1998 now U.S. Pat. No. 5,889,398 which application is a 371 of PCT/DE 95/00671 filed May. 16, 1995.

FIELD OF THE INVENTION

The present invention relates to a process for determining harmonic oscillations of a fundamental component of an electrical signal.

BACKGROUND INFORMATION

The journal, "Elektronik"2, Jan. 23, 1987 pp. 89–96, in particular pp. 92–93, describes a process in which an electrical signal is sampled with a sampling rate corresponding to an integer multiple of the fundamental component's frequency after analog pre-filtering. According to an example given, sampling is performed at a sampling rate of 2.56 kHz, and the spectral lines up to the sixth harmonic oscillation are determined in addition to the spectral line of a 160 Hz fundamental frequency. The spectral lines of the higher harmonics are greater than half the sampling rate (Nyquist frequency) and for real input signals provide the same values as the first eight spectral lines due to mirroring on the Nyquist frequency. The spectral lines of the higher harmonics can not, therefore, be selected and determined with such a process for a sampling frequency of 2.56 kHz. If these spectral lines are also to be determined with this conventional method, a sampling frequency twice as high, i.e., a sampling frequency of 5.12 kHz, would be required.

SUMMARY OF THE INVENTION

An object of the present invention is to provide a process for determining harmonic oscillations of a fundamental frequency of an electrical signal allowing relatively simple determination of even higher-order harmonics.

In accordance with the present invention, the signal is sampled with a sampling frequency corresponding to a non-integer multiple of the fundamental frequency. The sampled values of the signal are subjected, after analog-digital conversion, to a Discrete Fourier Transformation (DFT) to determine the harmonic oscillations. The DFT is performed by increasing the frequency resolution over several periods of the fundamental frequency to determine the harmonic oscillations.

The process of the present invention is based on the premise that, when sampling is performed with a non-integer multiple of the fundamental frequency, the higher harmonics are mirrored on a Nyquist frequency which does not coincide with a harmonic, but rather is located between two adjacent harmonics. Therefore, the higher harmonics mirrored on such a Nyquist frequency fall into the "gaps" between the lower-order harmonics and thus can be measured and selected. In order to obtain reproducible measuring results, it is necessary that the discrete Fourier transformation be carried out over a time interval corresponding to several periods of the fundamental frequency.

In general, it can be established that a sampling frequency $f_{ab}$ is used according to the present invention, which sampling frequency can be described by the following relationship (1):

$$f_{ab} = N' * f_{gr}. \tag{1}$$

In equation (1), $f_{gr}$ denotes the frequency of the fundamental frequency of the electrical signal to be analyzed. N' can be described by the following equation (2):

$$N' = M/L, \tag{2}$$

where M is an odd integer and L is an integer $\geq 1$. For example, if M=21 and L=2 are selected, this means that a sampling frequency $f_{ab}$ will be used according to the present invention, which is equal to 10.5 times the fundamental frequency $f_{gr}$. In this case, a discrete Fourier transformation must be performed over L periods, i.e., in the present case, over two periods.

One of the advantages of the process according to the present invention consists of the possibility of determining harmonic oscillations of a relatively high order by using a relatively low sampling frequency. This reduces the cost of measuring the harmonic or fundamental frequencies in an electrical signal. The longer measuring time over several periods of the fundamental frequency can often easily be taken into account, so that this does not represent a problem in most applications.

The frequency of the fundamental frequency of an electrical signal is often subject to fluctuations. This is true, for example, for electrical signals derived from the current or the voltage of an electric supply line. In order to also be able to use the process according to the present invention for such electrical signals and obtain accurate measurement results, in an improved version of the process according to the present invention, a measured value that provides the instantaneous frequency of the fundamental frequency of the electrical signal is obtained with a frequency measurement device supplied with the sampled values. The measured value is multiplied by a factor n to obtain a derived measured value, with factor n being equal to the quotient of a selected sampling frequency over the nominal frequency of the fundamental frequency of the electrical signal. The sampling is performed with a sampling frequency corresponding to the derived measured value.

Another advantage of this embodiment of the process according to the present invention is that, independently of the instantaneous frequency of the analog electrical signal analyzed, a sampling frequency corresponding to n times the instantaneous frequency of the electrical signal is used. This considerably increases the measurement accuracy, since the same number of samplings is always performed per period of the electrical signal, even for electrical signal frequencies that are different from the nominal frequency. Therefore, for this embodiment of the process according to the present invention, the sampling frequency is matched to the obtained frequency of the fundamental component.

Such a matching of the sampling frequency to the frequency of the fundamental component of an electrical signal is described in German Published Patent Application No. 43 30 179 A1.

In the process according to the present invention, the derived measured value can be supplied in various ways, e.g. directly, to the clock input of an analog-digital converter used for analog-digital conversion.

In another embodiment of the process according to the present invention, in order to obtain the highest possible accuracy, it is advantageous to form an intermediary value corresponding to the quotient of the magnitude of the clock frequency of a clock generator and the intermediary value providing the derived measured value in a quotient device, and to set the divider ratio of a frequency divider arranged between the clock generator and the clock input of an analog-digital converter used for analog-digital conversion so that the sampling frequency corresponding to the derived measured value is supplied to the clock input. In this way it is ensured that the sampling frequency is always derived anew from the clock frequency of the clock generator.

In order to achieve a smoothly operating process according to the present invention, it is also advantageous to modify the divider ratio as soon as possible after a few periods of the electrical signal have elapsed.

In the process according to the present invention the frequency measuring device can be a digital frequency meter in order to achieve the highest possible measurement accuracy.

BRIEF DESCRIPTION OF THE DRAWINGS

FIG. 3 shows a table illustrating mirroring of the harmonics in the fundamental band.

DETAILED DESCRIPTION

Figure 1:
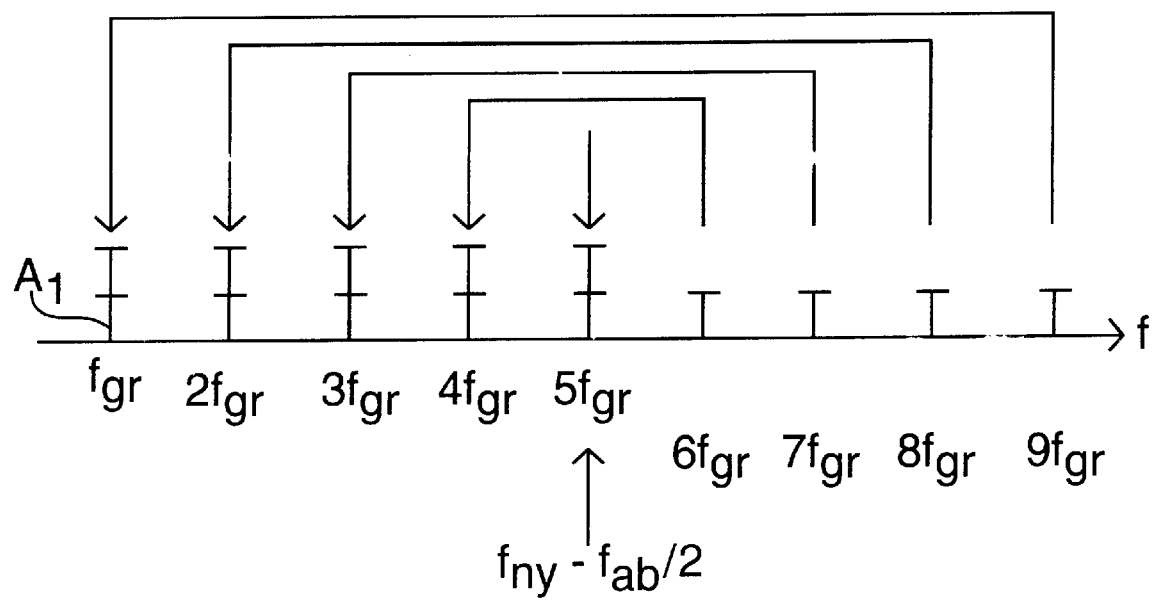
FIG. 1 shows a diagram illustrating a process for determining the fundamental component of an electrical signal.

In FIG. 1 the spectral lines of a fundamental frequency $f_{gr}$ with the value $A_1$ and harmonic oscillations $2f_{gr}$ through $5f_{gr}$ are plotted against the frequency, assuming that the harmonics also have a value of $A_1$. FIG. 1 further shows that a sampling frequency $f_{ab}$ is used, which corresponds to twice the frequency of the fourth harmonic $5f_{gr}$; the fourth harmonic is therefore the Nyquist frequency $f_{ny}$. In the conventional process, the fifth through eighth harmonics ($6f_{gr}$ through $9f_{gr}$) are mirrored on the Nyquist frequency $f_{ny}$, as can be seen from the lines with arrows of FIG. 1. Therefore, the spectral lines with an amplitude of $2*A_1$ are obtained for frequencies $f_{gr}$ through $5f_{gr}$ once it is assumed that the harmonics $6f_{gr}$ through $9f_{gr}$ have the same amplitudes $A_1$ as the harmonics $f_{gr}$ through $5f_{gr}$. FIG. 1 therefore clearly shows that in this conventional process, only the harmonics (up to the fifth harmonic) can be determined with a sampling frequency corresponding to twice the Nyquist frequency fny.

Figure 2:
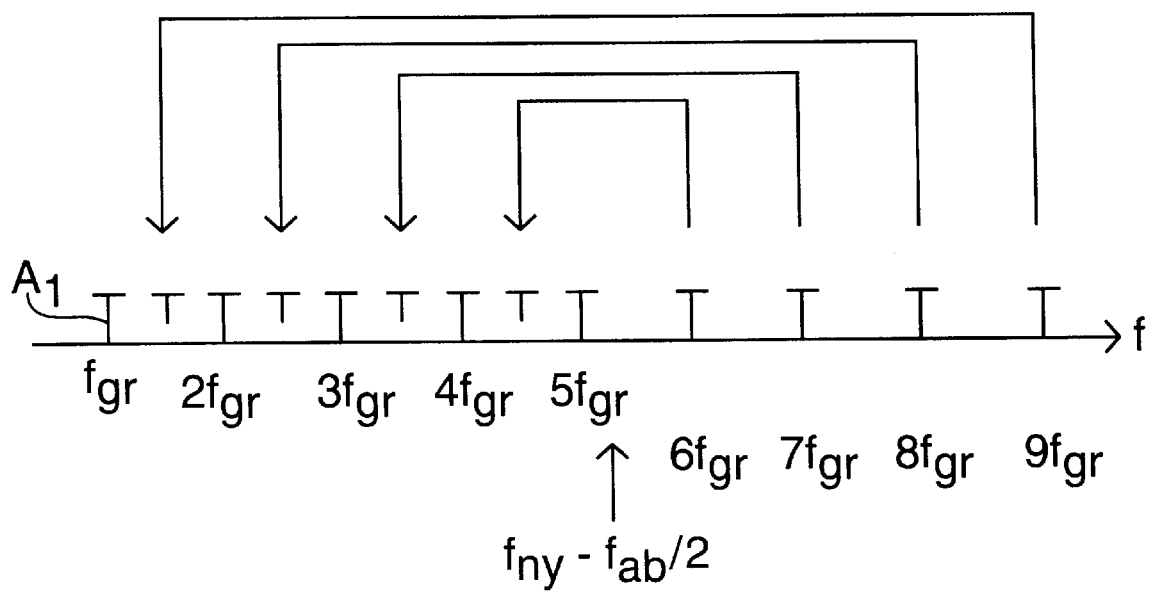
FIG. 2 shows a diagram of the process according to the present invention.

In FIG. 2 the spectral lines of the fundamental frequency $f_{gr}$ and harmonics up to the fourth harmonic $5f_{gr}$ are plotted against frequency (f). In this case it is assumed that a sampling frequency of $f_{ab}$ is used, which can be described by the following equation (3)

$$f_{ab}=N'*f_{gr}, \quad (3)$$

where N' is selected equal to 10.5. The Nyquist frequency is then $5.25*f_{gr}$, so that the higher harmonics are mirrored on this frequency with the result that the sixth through ninth harmonics fall in the gaps right in the middle among the lower order harmonics; this makes it possible to determine up to the ninth harmonic $9f_{gr}$. However, only a sampling frequency 10.5 times the fundamental frequency can be used.

For determining the spectral lines using a discrete Fourier transformation, a time interval equal to two periods of the fundamental frequency must be used in order to ensure that the measurement result can be obtained independently of when the first sampling is done with regard to the variation of the fundamental frequency over time. Accordingly, when N' is selected to be equal to 10.33, for example, the measurement is performed using the discrete Fourier transformation over three fundamental frequencies in order to accurately determine all spectral components.

If, for example, the process according to the present invention is used to determine harmonic oscillations of an electrical signal derived from a current or a voltage in a 60 Hz electric power supply line, the relationships illustrated in FIG. 3 are obtained for a sampling frequency corresponding to 16.5 times the line frequency of 60 Hz. The left-hand column (k) provides the components of the discrete Fourier transformation, while the second column shows the spectral lines $SL_u$ below the Nyquist frequency initially in Hz and then as the corresponding harmonic. "DC" denotes a DC component, "H16" denotes the 16th harmonic, i.e., the 15th higher harmonic, "H1" denotes the 60 Hz fundamental frequency, etc. The spectral lines $SL_0$ in the frequency band below the Nyquist frequency of 495 Hz are shown in the rightmost column of FIG. 3. The arrow in the third column indicates that the spectral lines $SL_0$ shown in the column to the right are mirrored on the Nyquist frequency. The characters in italics in the $SL_u$ column designate the spectral lines obtained by mirroring on the Nyquist frequency. FIG. 3 shows that even with a sampling frequency of only 990 Hz, spectral lines up to the 16th harmonic H16, i.e., up to 960Hz, can be determined with the process according to the present invention.

Figure 4:
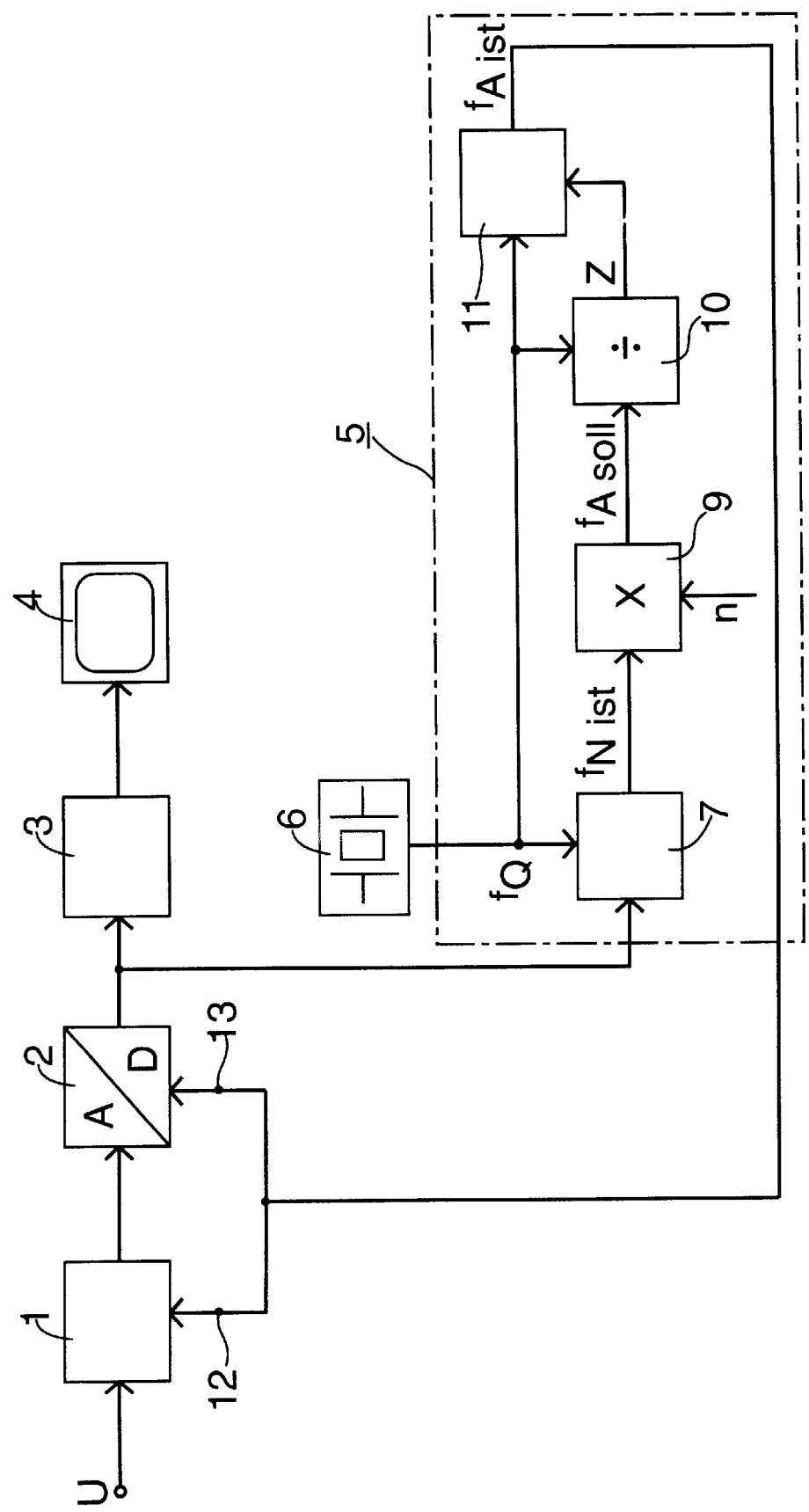
FIG. 4 shows a block diagram of a device for performing the process according to the present invention.

As shown in FIG. 4, an electrical signal U to be analyzed is sampled with a sampling device 1 at a sampling frequency selected according to the above description. The sampled values are converted to digital values in an analog-digital converter 2. The digital values obtained are subjected to a discrete Fourier transformation in a downstream data processing system 3. The spectral lines can then be displayed, for example, on a monitor 4 as illustrated in FIG. 2. The spectral lines can also be printed out on a suitable peripheral device.

In order to accurately determine even harmonics in an electrical signal U with a fluctuating frequency of its fundamental component, the arrangement having components 1 through 4 can be supplemented, as shown in FIG. 4, with a sampling signal generator 5 and a clock generator 6. Sampling signal generator 5 has, on its input side, a digital frequency meter 7 which can be designed and can operate, for example, as described in detail in a paper by J. Heydeman et al., "Microprocessor-Based Underfrequency Relaying," Delft University of Technology, The Netherlands, published in IEEE Conference Publication No. 24, Third International Conference on Developments in Power System Protection, 1985, pp. 24–28. Another, and possibly preferable, arrangement is described in German Patent No. 42 11 946 C1 or in the corresponding International Application No. WO 93/20454. Digital frequency meter 7 has a clock generator 6 which transmits a clock frequency $f_Q$ to digital frequency meter 7. A measured value $f_{Nist}$, providing the instantaneous frequency of signal U, appears at the output of digital frequency meter 7.

Measured value $f_{Nist}$ is supplied to a multiplier 9, where it is multiplied by a factor n. The factor n is the ratio between a selected sampling frequency $f_A$ to the nominal frequency of the fundamental component of the analog electrical signal U. For a voltage in an electric power supply line that is an analog electrical signal U, the nominal frequency is, for example, 60 Hz, which corresponds to the nominal frequency. The selected sampling frequency $f_A$ is, for example, 990 Hz, so that the factor n has the value 16.5.

At the output of multiplier 9, a derived measured value $f_{Asoll}$ appears which corresponds to a set sampling frequency. In the above numerical example, this frequency (in the case where voltage U has the exact frequency of 60 Hz) is therefore 990 Hz. If, however, the instantaneous frequency is, e.g., 59.5 Hz at the output of the digital frequency meter, and the measured value $f_{Nist}=59.5$ Hz, then a set sampling frequency of 981.75 Hz is obtained since the derived measured value $f_{Asoll}=*f_{Nist}$. The derived measured value $f_{Asoll}$ is supplied to a downstream quotient device 10, which also receives signals at a frequency $f_Q$ from clock generator 6. An intermediary value Z is then obtained at the output of quotient device 10; this value can be described by the following relationship:

$$f_Q/f_{Asoll}=Z.$$

The dividing ratio of a downstream frequency divider 11, whose one other input is connected to clock generator 6, is modified with this intermediary value Z. Therefore at the output of the frequency divider 11, a signal with a frequency $f_{Aist}$ is obtained, which can be described with the following equation:

$$f_{Aist}=f_Q*(f_{Asoll}/f_Q).$$

Frequency $f_{Aist}$, however, corresponds to the set sampling frequency, which ensures that analog-digital converter 2 is always clocked with a frequency $f_{Aist}$ that exactly corresponds to n times the instantaneous frequency of the electrical signal U. The output of frequency divider 11 is connected to clock inputs 12 and 13 of sampling device 1 and analog-digital converter 2.

In order to maintain a stable operation of the process according to the present invention, analog-digital converter 2 is not immediately supplied with the recently matched sampling frequency upon a change in measured value $f_{Nist}$, but a delay is generated in a manner not shown, which can be, for example, on the order of magnitude of four periods of the electrical signal U. Only after four periods of signal U have elapsed will a change in measured value $f_{Nist}$ affect the sampling frequency $f_{Aist}$.

What is claimed is:

1. A method for determining harmonic oscillations of a fundamental component of an electrical signal, the fundamental component having a fundamental frequency component, the method comprising the steps of:

sampling the electrical signal using a sampling frequency to generate first sampled values, the sampling frequency corresponding to a multiple of the fundamental frequency component, the sampling being performed at the sampling frequency so that a Nyquist frequency is between two adjacent harmonics;

converting the first sampled values into second sampled values using an analog-to-digital converter; and transforming the second sampled values using a discrete Fourier transformation to obtain the harmonic oscillations of the electrical signal, the discrete Fourier transformation being performed over a plurality of periods of the fundamental component to increase frequency resolution.

2. The method according to claim 1, wherein the sampling frequency is in accordance with the following relationship:

$$f_{ab}=N'*f_{gr}$$

wherein $f_{ab}$ is the sampling frequency, N' is a quotient of M, an odd integer, and L, an integer>1, wherein $f_{gr}$ is a fundamental frequency of the electrical signal, and wherein the discrete Fourier transformation is performed over L periods of the fundamental component.

* * * * *